(12) United States Patent
Liu et al.

(10) Patent No.: US 6,567,273 B1
(45) Date of Patent: May 20, 2003

(54) SMALL SILICON DISK CARD WITH A USB PLUG

(75) Inventors: Wen-Tsung Liu, Hsin Tien (TW); Chia-Li Chen, Hsin Tien (TW); Mi-Chang Chen, Hsin Tien (TW)

(73) Assignee: Carry Computer Eng. Co., Ltd., Hsien Tien (TW)

( * ) Notice: Subject to any disclaimer, the term of this patent is extended or adjusted under 35 U.S.C. 154(b) by 0 days.

(21) Appl. No.: 10/131,132

(22) Filed: Apr. 25, 2002

(30) Foreign Application Priority Data

Feb. 6, 2002 (CN) ..................... 091201367 U (51) Int. Cl.$^7$ .......................... H05K 5/02; H01R 13/40
(52) U.S. Cl. ................. 361/737; 361/752; 439/131; 439/528
(58) Field of Search ............... 361/737, 740, 361/741, 747, 752, 755, 756, 764; 174/50; 439/131, 172, 528, 532

(56) References Cited

U.S. PATENT DOCUMENTS

| | | | | |
|---|---|---|---|---|
| 5,155,663 A | * | 10/1992 | Harase | 361/395 |
| 5,562,504 A | * | 10/1996 | Moshayedi | 439/638 |
| 5,660,568 A | * | 8/1997 | Moshayedi | 439/654 |
| 5,773,332 A | * | 6/1998 | Glad | 439/344 |
| 6,005,774 A | * | 12/1999 | Chiba et al. | 361/737 |
| 6,059,583 A | * | 5/2000 | Croft et al. | 439/131 |
| 6,135,786 A | * | 10/2000 | Johnson et al. | 439/76.1 |
| 6,215,656 B1 | * | 4/2001 | O'Neal et al. | 361/686 |
| 6,217,351 B1 | * | 4/2001 | Fung et al. | 439/131 |
| 6,385,677 B1 | * | 5/2002 | Yao | 710/102 |
| 6,439,464 B1 | * | 8/2002 | Fruhauf et al. | 235/492 |

* cited by examiner

Primary Examiner—David Martin
Assistant Examiner—Dameon E. Levi
(74) Attorney, Agent, or Firm—Bacon & Thomas (57) ABSTRACT

A silicon disk card with a USB plug includes an electric circuit board with at least one flash memory and a bridging chip, and a module in the shape of a rectangular frame formed by injection molding of plastic. The module is provided on one side thereof with an interface pin board, and on the opposite side thereof with a slot to receive the USB plug therein, the slot having a leading function to lead the USB plug out of the module. The silicon disk card with the USB plug has the function of twin interface data transmitting, the bridging chip being used therein to decide which interface is seeking access to data in the flash memories.

9 Claims, 6 Drawing Sheets

SMALL SILICON DISK CARD WITH A USB PLUG

BACKGROUND OF THE INVENTION

1. Field of the Invention

The present invention relates to a small silicon disk memory card, and especially to a silicon disk memory card with a USB plug. The card can be a PC card or a Compact Flash card type I/II specification etc. having not only the memory and storing functions of the originally available PCMCIA interface or CF card interface, but also a standard USB "plug and play" function. This has the advantage that the memory, storing, and "plug and play" functions can be carried out without the need for an additional electric power source, while satisfactorily meeting all requirements of consumers.

2. Description of the Prior Art

Along with popularization of the commodities of information such as computers, digital cameras, digital recording pens etc., demand by consumers for digital storage equipment gets larger and larger from day to day. Conventional storage media provided by manufacturers include the flash memories of: PCMCIA cards, Compact Flash cards, Smart Media cards, Multimedia cards, Secure Digital cards and Memory Stick cards etc. These storing media gradually take the place of soft and hard disks to become the prevailing storing devices. In particular, more and more consumer electronic products, such as digital cameras, MP3 walkmans, personal digital assistants (PDAs) and computers (PC/NB) etc. have adopted CF cards (Compact Flash cards) and PC cards (PCMCIA cards) as their storing media. Three kinds of products, including card readers, MP3 walkmans, and Removable Hard Disks, have been further combined with the CF cards or PC cards recently. Removable Hard Disks, advertised as "small in volume and convenient for use," are most noticed in the markets.

The kinds of Removable Hard Disks in the markets are numerous, including Disk on Keys, ThumbDrives etc. They not only have the feature of being small in volume and convenient for use, but also are provided each with an integrally formed USB "Plug And Play" plug. A Removable Hard Disk can be formed without installing a driver program, and a user can easily store data in the silicon disk card. In comparison with the same kind of products including Compact Flash cards, Smart Media (SM) Cards, Multimedia (MMC) cards, Secure Digital (SD) cards and Memory Stick (MS) cards etc., Removable Hard Disks are advantageous in being small in volume, large in capacity, fast in speed, high in compatibility, strong in structure and low in cost.

In addition, a silicon disk card with a USB plug not only has the effect of enabling plug and play without any electric power supply, but also has the advantages of high safety, high data transmission speed (12 mb/sec.), hot swapping, convenient operation, no need of any computer assembling experience or any computer changing device, and of being able to support systems such as Windows 98 and Mac OS 8.6 etc. It is no wonder that consumers and manufacturers get more and more fond of products like Removable Hard Disks and ThumbDrives. The products all have standard interfaces (USB) and large storage capacity, and will in the future have even larger storage capacity; they can be quickly connected to communicate with computers having USB plugs, and can easily have data directly transmitted to and from other types of consumer electronic and communication devices. For traveling commercial men, the feature of portability of the storage devices of Removable Hard Disks can provide convenience for data storage and amendment. And for general students, the feature of high capacity of the storage devices of Removable Hard Disks can provide the speed of operation required by MP3, VIDEOM GAME, PHOTO etc., in devices such as digital cameras, digital recorders, MP3 players, personal digital assistants (PDA), networking machines, video signal converters (STB), mobile phones, notebooks and information appliances (IA) etc.

The above-described Removable Hard Disks may be connected with various conventional utility programs such as e-mail, communication address book, ICQ etc., requiring only that the opposite side has a digital device such as a computer or a hand phone in order to easily make contact with others. Also, the Removable Hard Disks have small volumes and small weight, and yet are similar in operation to general magnetic disks, have a large data storage space up to 8 MB–1 GB, and the storage devices of the new generation can even have their storage spaces extended [unlimitedly] without limit. Moreover, the Removable Hard Disks can be designed to [be of] the specification of copy preventability and secure connection, so that they are more widely applicable. In addition to offering prevention from inadvertent deletion of data, they may be used to store video, acoustic data, books and games data etc. of works with copyrights, and even can be extended to be applicable to the electronic commercial field including value-save cards, telephone card and membership cards etc. The imaginable applications of newly developed favored products involving such storage media are unlimited, the storage devices being directly connectible to an unlimited variety of devices with insertion slots capable of using corresponding storage media. The storage devices have the functions of "plug and play", high data transmission speed and high storing capacities, and do not increase the cost of the Removable Hard Disks.

PRIOR ARTS

The Removable Hard Disks are newly developed storage media with high efficiency, which are constantly being updated to perform new functions. The technical idea is similar to that of the silicon disks, the two kinds of products both including semiconductor based memories as storage media supplemented by some electric resistances, capacitors and bridging chips as the elements for controlling data discrimination. However, because the Removable Hard Disks do not have a unified standard and specification, like the various small silicon disks in the markets, their sizes and appearances are different from one another. Although they are alike in having internal memories and microprocessors, and thereby can have the advantages of high data transmission speed and high storing capacities, the difference is that they (DF, SD, MMC, SM silicon disks etc.) have different interfaces. A consumer facing such a situation will have a limited choice of compatible products and can only be at the mercy of manufacturers. As a result, the consumer may end up owning a plurality of incompatible storage media increasing the cost of the consumer in purchasing, and resulting in the problem that users are not able to have effective fluent intercommunication and interchangeability. These are significant defects and result in substantial inconvenience for the consumer in use.

In addition, conventional silicon disks or Removable Hard Disks are all designed for specific groups of digital products, such as: those which have USB sockets that are specific for USB plugs, those which have PCMCIA sockets that are specific for PCMCIA interface pin boards etc. They are different from one another and be interchangeably used. Although there have been various small silicon disks (SD, MMC, SM cards etc.) are able to convert themselves into storage media of PCMCIA or CF interface by means of an adapter, there is no such adapter to convert a PCMCIA or CF interface into a USB interface.

SUMMARY OF THE INVENTION

In view of the above statement, in order to solve the above stated problems and to get the effects required, the inventor of the present invention studied with tests and developed a silicon disk card with a USB plug that solves the problem that conventional silicon disks are unable to combine with digital products provided with USB plugs.

Particularly, the silicon disk card with a USB plug provided by the present invention is comprised of: a USB plug, an electric circuit board, at least one flash memory and a bridging chip, and a module in the shape of a rectangular frame formed by injection molding of plastic. The electric circuit board can be fixed in the rectangular frame. The module is provided on one side thereof with an interface pin board, and on the opposite side thereof with a slot to receive the USB plug therein. The slot can have a leading function to lead the USB plug out of the module, and can be applicable to different type of USB plugs.

Another object of the present invention is to exploit the fact that conventional silicon disks such as PC or CF cards have added with USB plugs, by providing such silicon disks with USB plugs with the function of twin interface data transmitting, a bridging chip being used therein to decide which interface has access to data. Such a USB plug enables the present invention to be a portable and favorite Removable Hard Disk. The present invention is applicable to and can communicate without [hindering] hindrance with various portable digital products, PCs' and peripheral equipments of computers, to provide a user with excellent convenience. In this mode, the problems that the conventional silicon disks or Removable Hard Disks are not interchangeable and the high cost to the consumer can be solved.

Another object of the present invention is to provide an insertion slot to receive a USB plug therein, and enable the USB plug to be ejected out of the silicon disk card of the present invention in various modes such as by pushing, by rotation etc. The present invention can be combined with any of the currently available USB sockets.

Additionally, the silicon disk card with a USB plug of the present invention not only has the originally available transmitting interface of the PCMCIA/CF specification, it further has a twin interface including a USB plug to make the numerous storage media which are incapable of being standardized in the markets able to be commonly used with the Removable Hard Disks of the present invention. This is good news for systems manufacturers or consumers. Furthermore, the present invention solves the problems that a conventional silicon disk can only be used for a single group, that a consumer has no choice in purchasing various storage media in the markets, and that various portable digital products, computer systems or peripheral equipment of computers are not able to have effective fluent intercommunication and interchangeability.

The present invention will be apparent in its contents of technique and characteristics after reading the detailed description of the preferred embodiment thereof in reference to the accompanying drawings.

DETAILED DESCRIPTION OF THE PREFERRED EMBODIMENT

Figure 1:
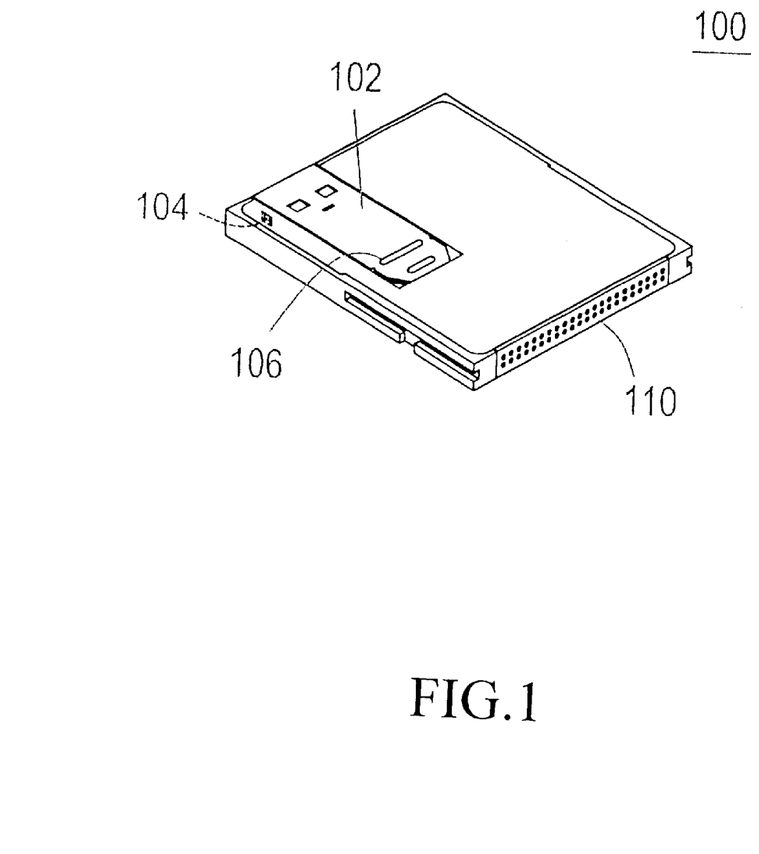
FIG. 1 is a perspective view of the first embodiment of the present invention with a USB plug received in the silicon disk card thereof.

Referring first to FIG. 1, which is a perspective view of the first embodiment of the present invention, a USB plug 102 is received in the silicon disk card 100. The USB plug 102 is a push-in style plug and is received in the silicon disk card 100 (CF card) of the present invention without being exposed enabling computers or peripheral equipment of computers to be connected to a USB device without affecting use of the silicon disk cards. The silicon disk card may be either of two types, i.e., Type I and Type II; both of which have the same interface specification, including an interface pin boards 110 with 50 pins.

Figure 2:
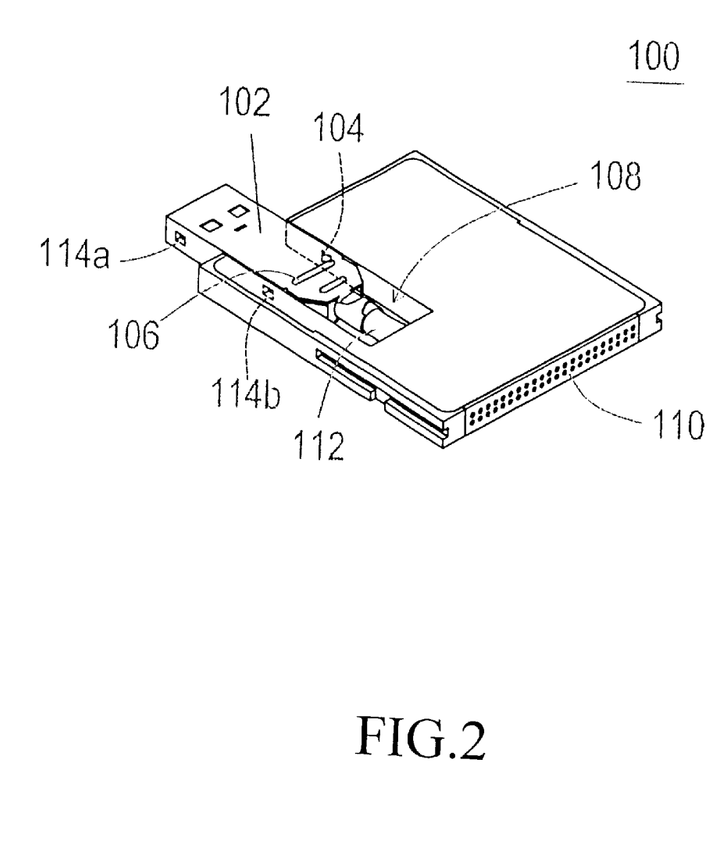
FIG. 2 is a perspective view showing the USB plug in FIG. 1 is pushed out of the silicon disk card of the present invention.

Referring to FIG. 2 which is a perspective view in which the USB plug 102 in FIG. 1 is pushed out of the silicon disk card 100, the USB plug 102 is placed in the slot 108 of the silicon disk card 100, and can be pushed out by means of a plurality of protruding ribs 106 provided on the USB plug 102. The USB plug 102 is provided on both of the two sides thereof with a front positioning hole 114a and a rear positioning hole 114b to engage with positioning pieces 104 provided on two framing sides located laterally of the slot 108. In other words, when the USB plug 102 is pushed out, the front positioning hole 114a and the positioning pieces 104 provided laterally are in the state of engagement and positioning, and the rear positioning hole 114b can be moved forwards into the slot 108 to make engagement with the positioning pieces 104 when the pushing force is increased to some extent. The USB plug 102 can be fixedly positioned with such a design for engagement.

Figure 3:
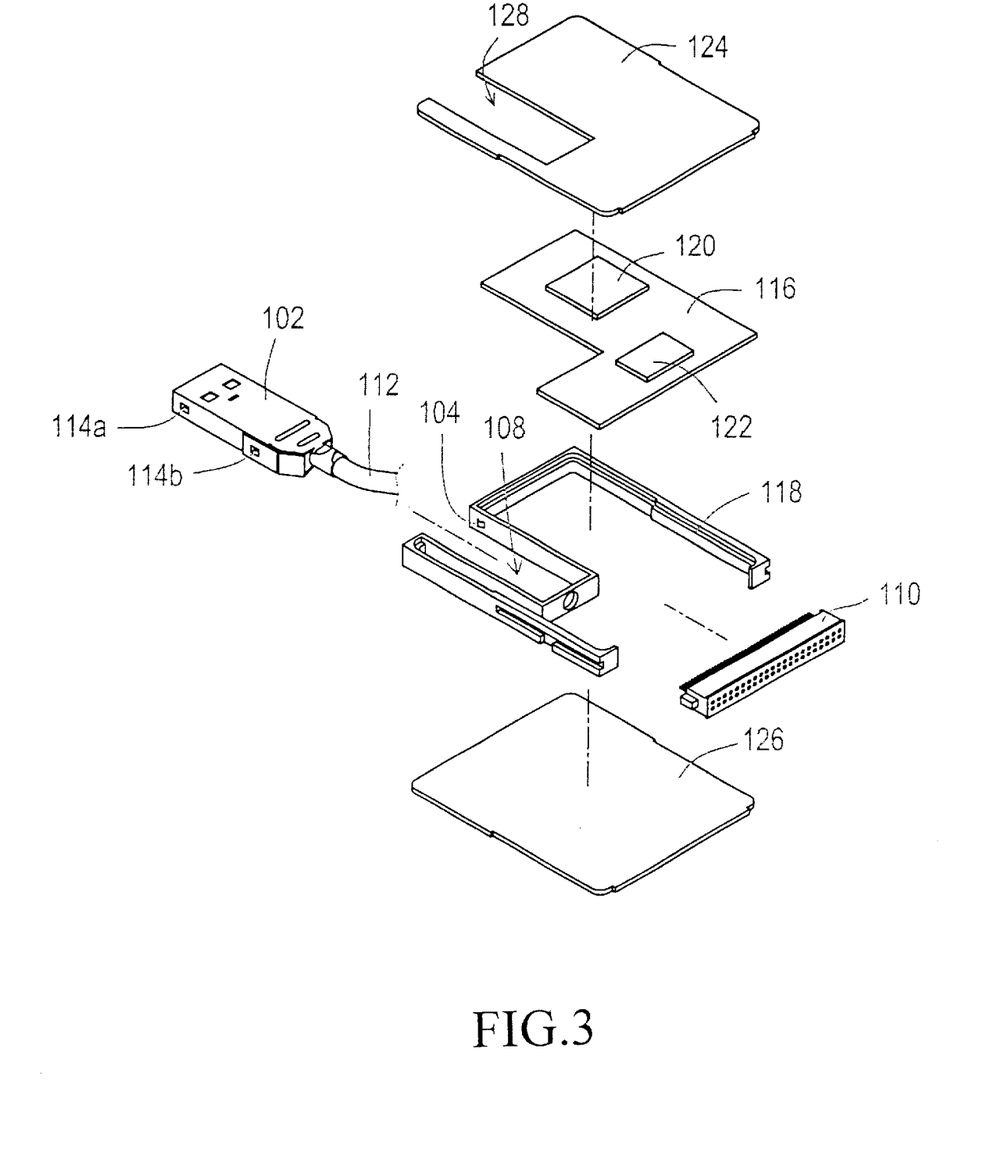
FIG. 3 is an analytical perspective view of the first embodiment of the present invention.

Referring to FIG. 3 which is an analytical perspective view of the first embodiment of the present invention, the silicon disk card 100 provided with the USB plug 102 includes an electric circuit board 116, a module 118, an interface pin board 110 and a top and a bottom plate 124, 126 etc. The electric circuit board 116 mainly has at least one flash memory 122 and a bridging chip 120 for discriminating which interface is transmitting data to access the flash memories 122. The module 118 in the shape of a rectangular frame is formed of plastic or rubber by injection molding. The electric circuit board 116 can be fixed in the rectangular frame. The module 118 is provided on one side thereof with the interface pin board 110, which has 50 pins as is a standard, and on the opposite side thereof with a slot 108 to receive the USB plug 102 therein. The two parallel sides of the rectangular frame located laterally of the slot 108 can lead the USB plug 102 out of the module 118. The USB plug 102 has front positioning holes 114a and rear positioning holes 114b engaged with positioning pieces 104 provided on the sides located laterally of the slot 108. After the module 118 is mounted with the electric circuit board 116, the interface pin board 110, and the USB plug 102, the top and the bottom plates 124, 126 are installed to protect the interior electronic elements and to prevent dust. When either of the top and the bottom plates 124, 126 is used to form the slot 108, it must be cut to form a corresponding notch 128 thereon for pushing out the USB plug 102. In view of this, the silicon disk card 100 with the push-in style USB plug 102 has the function of twin interface (CF and USB) data transmitting, providing a significant integration to render the twin interface compatible with all kinds of digital products and peripheral equipment for computers, and thereby become a new developed favorite storage media.

As an alternative to use of transmission line 112 depicted in FIGS. 2–3 to connect the USB plug 102, the right and left positioning pieces 104 may be used to provide a fixed-point electric connection so that when the USB plug 102 is pushed out to make the rear positioning holes 114b engage with the positioning pieces 104, a data transmitting function is obtained.

Figure 4:
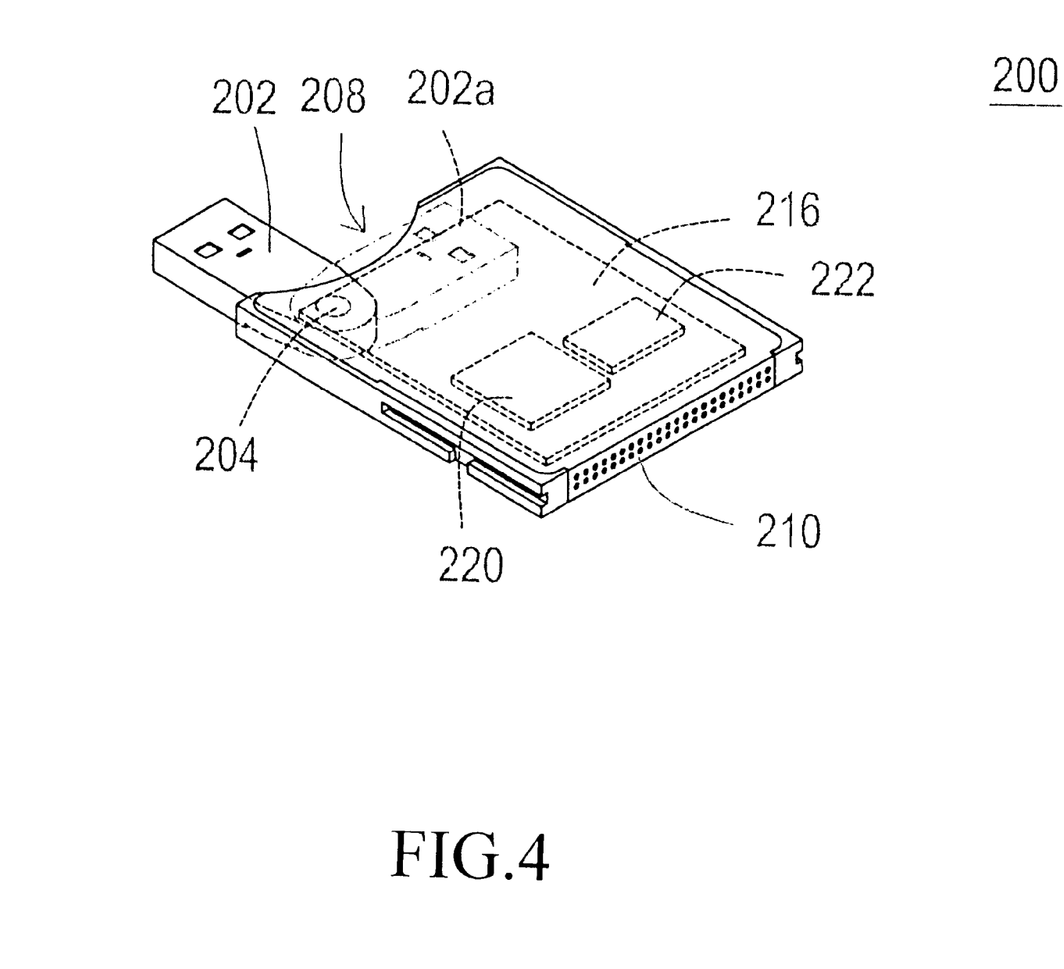
FIG. 4 is a schematic perspective view showing the action of rotating of the USB plug in a horizontal plane out of the silicon disk card of the present invention.

FIG. 4 is a schematic perspective view showing the action of rotating the USB plug 202 in a horizontal plane out of a silicon disk card 200 of the present invention. The in-horizontal-plane rotating type silicon disk card 200 is another preferred embodiment of the present invention. On the side opposite the side with an interface pin board 210, the CF card has a space to receive therein a USB plug 202. The number 202a indicates a USB plug [being] hidden in the CF card. The tailing end of the USB plug 202 is fixed on an electric circuit board 216 by means of a first rotating axle 204, so that the USB plug 202 can be rotated about the rotating axle 204 for a suitable angle of about 90 degrees to enable removal from a slot 208 in parallel to the electric circuit board 216; and the rotating axle 204 is used to make electric connection with the electric circuit board 216. When a bridging chip 220 detects that the USB plug 202 is inserted into a computer or its peripheral product with a USB socket (not shown), the advantages of a Removable Hard Disk including data access to a flash memory 222, the function of plug and play, hot swapping etc. can be activated. Certainly, such a fixed-point transmitting mode can also include the data transmitting and delivering mode with a conventional transmission line.

Figure 5:
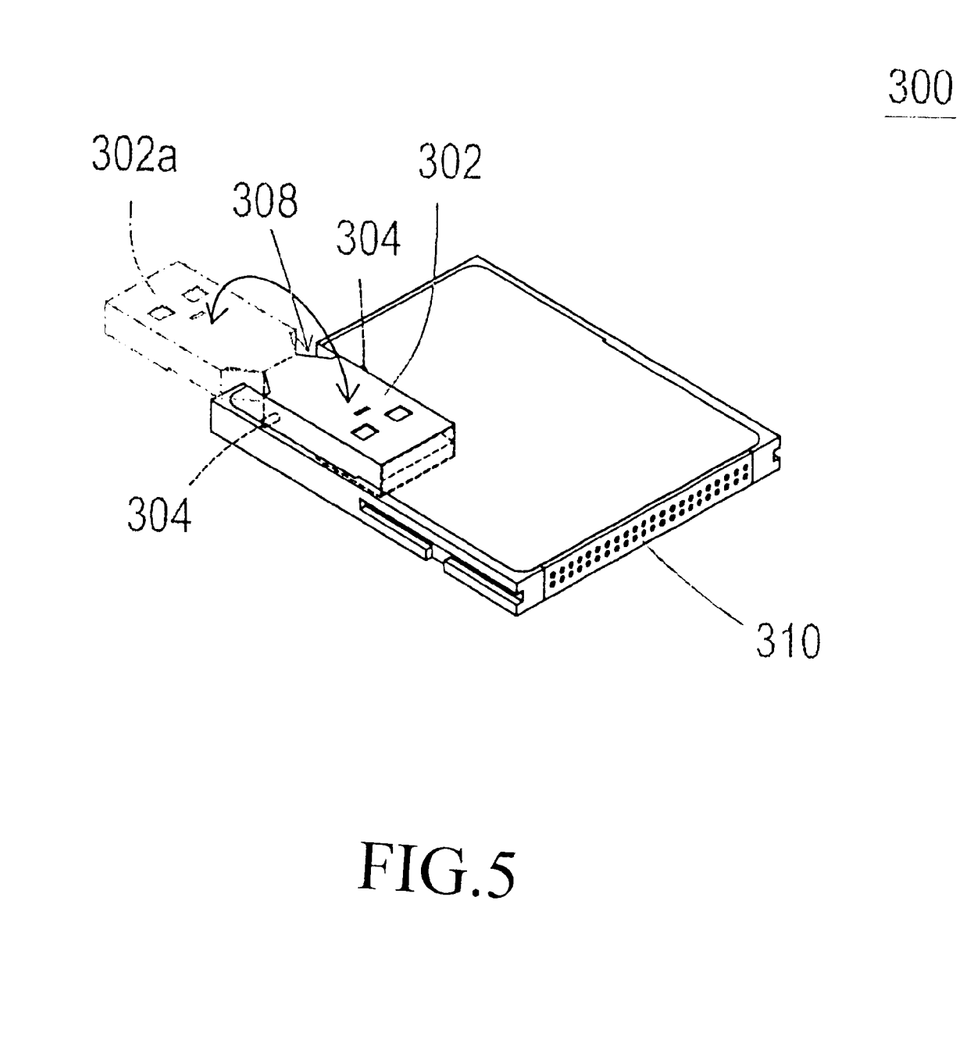
FIG. 5 is a schematic perspective view showing the action of rotating of the USB plug in a vertical plane out of the silicon disk card of the present invention.

FIG. 5 is a schematic perspective view showing the action of rotating of a USB plug 302 in a vertical plane out of a silicon disk card 300 of the present invention. The in-vertical-plane rotating type silicon disk card 300 is another preferred embodiment of the present invention. The preferred embodiment is different from that of FIG. 1 in that it is rotated out. Particularly, a second rotating axle 304 provided on the tailing end of the USB plug 302 is fixed on both the parallel framing sides located laterally of a slot 308. The USB plug 302 can be rotated out by a suitable angle of about 180 degrees. The number 302a indicates the USB plug being rotated out so that it can be connected with some other USB socket (not shown) to function as a Removable Hard Disk. Because the card of this embodiment is otherwise identical in structure to the above embodiments, no further description is required here. Therefore, the USB plugs of FIGS. 1–5 can be moved out by pushing, rotating in a horizontal plane, or rotating in a vertical plane, can all be received in their corresponding slots without influencing the sizes and appearances of the original silicon disk cards, and have the effects of being easy to position and convenient in use.

Figure 6:
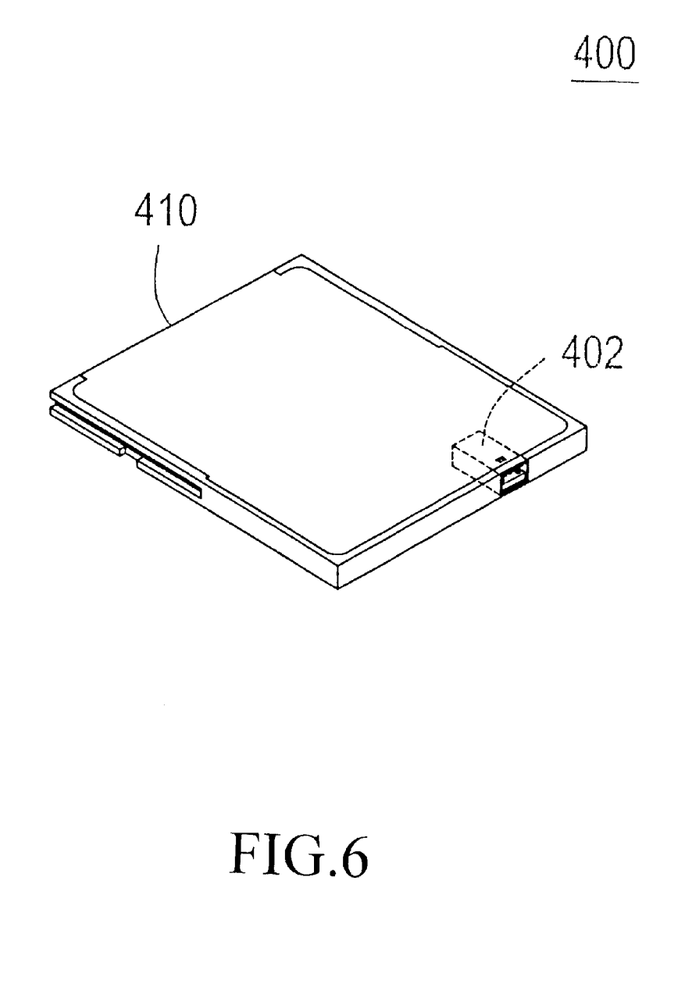
FIG. 6 is a perspective view showing a small USB socket provided in the present invention.

FIG. 6 is a perspective view showing a small USB socket 402. A silicon disk card 400 with the small USB socket (mini USB) 402 of the present invention is provided in any one of the four sides of a rectangular frame. In this drawing, the small USB socket 402 is inside of the side in opposition to the interface pin board 410 with 50 pins, but it is not limited to this position, and can instead be allocated inside of either of the two neighboring sides. The small USB socket 402 is welded to an electric circuit board (not shown). The principle and structure here are identical to those of the above embodiments, and no further description is required here. When a corresponding small USB plug is inserted in the small USB socket 402, reading, storing etc. of the functions of a Removable Hard Disk can be performed directly.

Figure 7:
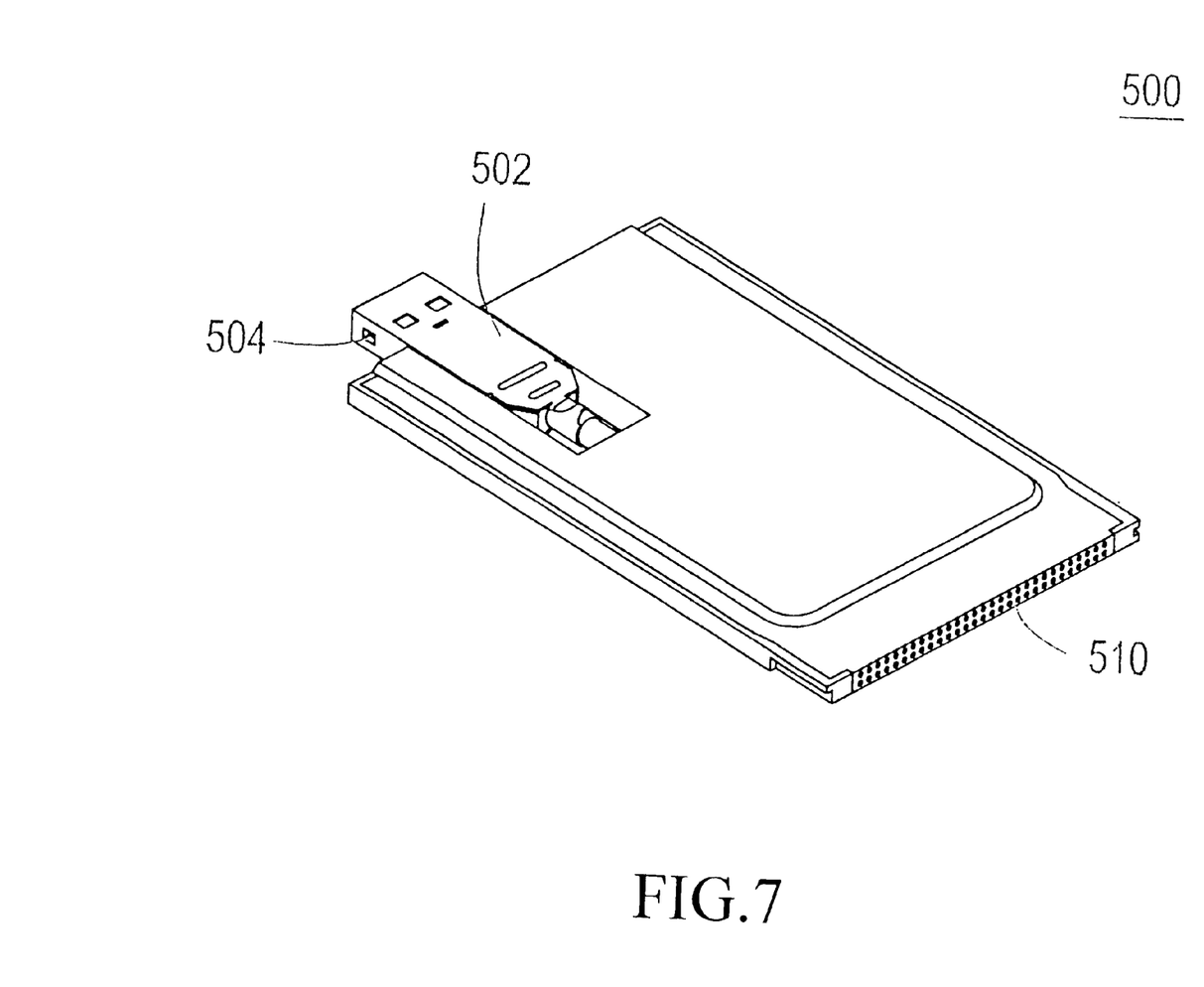
FIG. 7 is a schematic perspective view of another embodiment of the present invention.

FIG. 7 is a schematic perspective view of another embodiment of the present invention and shows a silicon disk card 500 with a push-in style USB plug 502 and having a PCMCIA card specification including an interface pin board 110 with 68 pins as is standard. The PCMCIA card can be designed in the same manner as the above stated various preferred embodiments. To this end, the card is provided with a front positioning hole 504 and positioning pieces etc. (not-shown), the principle and structure here being to those of the Compact Flash card, and no further description is required.

In conclusion, the present invention has the following three advantages:

1. The present invention is applicable to and can communicate without hindrance with various portable digital products, PCs, and peripheral equipment of computers, to provide a user with excellent convenience. In this mode, the problems of incompatibility between the conventional silicon disks and Removable Hard Disks, and the cost the consumer can be solved.

2. The present invention provides an insertion slot to receive a USB plug therein, and to have the USB plug extend out of the silicon disk card in various leading modes such as by pushing, by in-horizontal-plane rotating and by in-vertical-plane rotating etc. The present invention can be combined with any product with a USB socket, so that the silicon disk card can meet market requirements.

3. Additionally, the present invention not only can use silicon disk cards with the originally available PCMCIA specification and CF specification, it can further provide a Removable Hard Disk with a USB interface. This is good news for systems manufacturers and consumers. Moreover, the present invention solves the problems that a conventional silicon disk can only be used for a single group, that a consumer has no choice in purchasing various storage media, and that various portable digital products, computer systems or peripheral equipment of computers are unable to have effective fluent intercommunication and interchangeability.

The abovementioned titles of components are only for illustrating the technical content of a preferred embodiment of the present invention, and not for giving any limitation to the scope of the present invention. It will be apparent to those skilled in this art that various equivalent modifications or changes can be made without departing from the spirit and scope of the present invention, and shall fall within the protection scope of the appended claims.

What is claimed is:

1. A silicon disk card with a USB plug comprising:
   an electric circuit board faith at least one flash memory and a bridging chip;
   a module including a rectangular plastic frame, said module being provided on one side thereof with an interface pin board electrically connected to said circuit board, and on the opposite side thereof with a slot to receive said USB plug therein, said USB plug also being electrically connected to said circuit board, wherein said silicon disk card forms a twin interface data transmission means for enabling access to said flash memory by both a USB interface and said interface pin board, said bridging chip provides a means for discriminating which interface is accessing said data, and said slot forms a means for guiding said USB plug out of said module when in use in order to connect said plug to an external USB device.

2. A silicon disk card with a USB plug as claimed in claim 1, wherein said USB plug is connected to said circuit board by a transmission line.

3. A silicon disk card with a USB plug as claimed in claim 1, wherein said USB plug is connected to said circuit board by a fixed point connection.

4. The silicon disk card with a USB plug as in claim 1, wherein said module includes a top plate and a bottom plate, said circuit board, said interface pin board, and said USB plug being mounted between said top plate and said bottom plate, said top plate and said bottom plate being arranged to protect interior electronic elements from dust, wherein either of said top and bottom plates forms said slot.

5. The silicon disk card with a USB plug as in claim 1, wherein said silicon disk card is a PCMCIA card and said interface pin board has 68 pins.

6. The silicon disk card with a USB plug as in claim 1, wherein said silicon disk card is a Compact Flash type I/II card and said interlace pin board has 50 pins.

7. The silicon disk card with a USB plug as in claim 4, wherein said USB plug is fixed on electric circuit board by an axle, so that said USB plug is adapted to rotate about said axle to a position in which the USB plug extends out of said slot during use, and said USB plug is adapted to be received in said slot when not in use.

8. The silicon disk card with a USB plug as in claim 4, wherein said USB slot is fixed on two parallel framing sides located laterally of said slot by al axle, so that said USB plug is adapted to rotate in a vertical plane about said axle to a position in which the USB plug extends out of said slot during use, and said USB plug is adapted to be received in said slot when not in use.

9. A silicon disk card with a USB socket comprising:

an electric circuit board with at least one flash memory and a bridging chip;

a module in the shape of a rectangular frame formed by injection molding of plastic, said module being provided on one side thereof with an interface pin board; and a small USB socket provided in any one of the four sides of said rectangular frame to enable connection of a USB plug, wherein said silicon disk card forms a twin interface data transmission means for enabling access to said flash memory by both a USB interface and said interface pin board, said bridging chip provides a means for discriminating which interface is accessing said data.

* * * * *